United States Patent [19]

Kataoka et al.

[11] Patent Number: 5,684,325
[45] Date of Patent: Nov. 4, 1997

[54] LIGHT-TRANSMISSIVE RESIN SEALED SEMICONDUCTOR

[75] Inventors: Ichiro Kataoka, Kyoto; Takahiro Mori, Ikoma; Satoru Yamada; Hidenori Shiotsuka, both of Kyoto; Ayako Komori, Nara, all of Japan

[73] Assignee: Canon Kabushiki Kaisha, Tokyo, Japan

[21] Appl. No.: 429,036

[22] Filed: Apr. 26, 1995

[30] Foreign Application Priority Data

Apr. 30, 1994 [JP] Japan ................................. 6-114115

[51] Int. Cl.$^6$ ............................................. H01L 31/0203
[52] U.S. Cl. ............................ 257/433; 257/787; 257/788; 257/790
[58] Field of Search ................................ 257/787, 433, 257/788, 790; 437/211

[56] References Cited

U.S. PATENT DOCUMENTS 5,389,159   2/1995   Kataoka et al. ........................ 136/251
5,397,401   3/1995   Toma et al. ............................ 257/788

FOREIGN PATENT DOCUMENTS

62-9232    2/1987   Japan ............................. H01L 31/04
62-14111   3/1987   Japan ............................. H01L 31/04
3-24752    2/1991   Japan ................................. 257/790

*Primary Examiner*—Tom Thomas
*Assistant Examiner*—Roy Potter
*Attorney, Agent, or Firm*—Fitzpatrick, Cella, Harper & Scinto

[57] ABSTRACT

A light-transmissive resin sealed semiconductor is provided which is sealed at least at a light incident face of a photoelectric transducer with an organic polymer resin layer, which comprises a copolymer of ethylene and an unsaturated fatty acid ester. This light-transmissive resin sealed semiconductor has a surface layer which has high heat resistance, and low hygroscopicity, and does not liberate a free acid even in the presence of moisture. Thereby the semiconductor is prevented from deterioration of performances caused by the drop of the shunt resistance of the photovoltaic element under high humidity environment.

41 Claims, 3 Drawing Sheets

LIGHT-TRANSMISSIVE RESIN SEALED SEMICONDUCTOR

BACKGROUND OF THE INVENTION

1. Field of the Invention

The present invention relates to a semiconductor sealed with a light-transmissive resin, particularly to a surface-covering material for solar cell module which is sealed with a light-transmissive organic high polymer resin at the light-incident (light-receiving) face side of the photovoltaic element.

2. Related Background Art

In recent years, environmental pollution has become a worldwide concerns. In particular, global temperature rise caused by the greenhouse effect of emitted carbon dioxide is a serious problem. Therefore, clean energy generation without using fossil fuel is strongly desired. The solar cell, which is a photoelectric transducer, is promising as a clean energy source at the moment because of the safety and ease of handling.

The solar cell includes various types, exemplified typically by crystalline silicon solar cells, polycrystalline silicon solar cells, amorphous silicon type solar cells (herein, amorphous silicon includes microcrystalline silicon), copper indium serenade solar cells, compound semiconductor solar cells, and the like. Of these, thin-film crystalline silicon solar cells, compound semiconductor solar cells, and amorphous silicon solar type cells are actively studied since these types of solar cells can readily be produced in a large-area form at a low cost.

Further, of these solar cells, thin film solar cells typified by amorphous silicon type solar cells, which are produced by depositing silicon on a substrate having an electroconductive surface such as a flexible electroconductive metal substrate and subsequently forming thereon a light-transmissive electroconductive layer, are promising as a future module model because of the light weight, the high impact strength, and the high flexibility thereof. However, this type of module is required to have the light-incident face covered with a light-transmissive material to protect the solar cell, in contrast to the one produced by silicon deposition on a glass substrate. In conventional solar cell modules, a light-transmissive thin film of fluoride polymer such as a fluoroplastic film and a fluoroplastic coating is applied as the outermost covering layer, and a light-transmissive thermoplastic organic resin is provided beneath the covering layer. The fluoroplastics (fluoride polymer) are employed as the outermost layer because of the high weatherability and the high water-repellency to keep the light transmissivity without decrease in the conversion efficiency of the solar cell module caused by yellow coloring or white turbidity, or soiling of the surface. The light-transmissive thermoplastic resin is employed as the filler because of economy in use in large amount for protection of the inner photovoltaic element.

Figure 4:
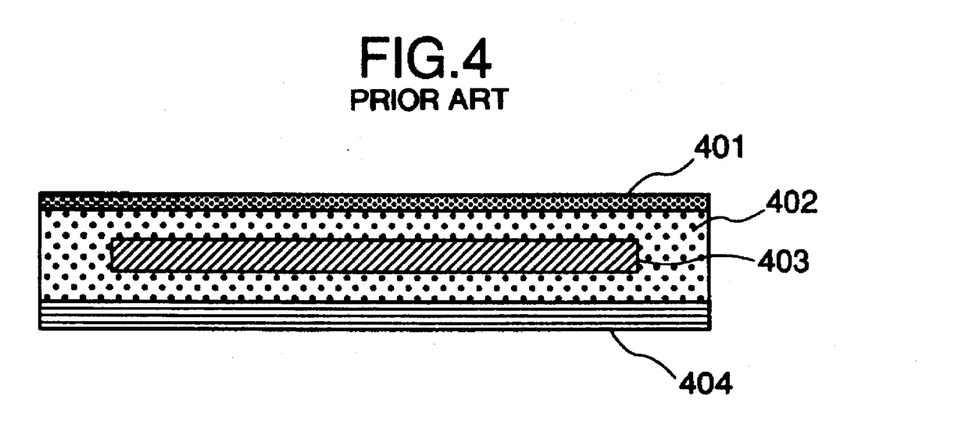
FIG. 4 is a schematic sectional view of the solar cell module for comparison.

FIG. 4 shows an example of such a solar cell module. In FIG. 4, the module is constituted of a fluoroplastic (fluoride polymer) thin film layer 401, a light-transmissive thermoplastic organic resin 402, a photovoltaic element 403, and an insulation layer 404. In this example, the back face of the photovoltaic element is covered with the same organic resin as the light-incident face. More specifically, the fluoroplastic thin film layer 401 is a fluoride polymer film such as a film of ETFE (ethylene-tetrafluoroethylene copolymer), and a film of PVF (polyvinyl fluoride). The light-transmissive thermoplastic organic resin 402 is exemplified by EVA (ethylene-vinyl acetate copolymer), and butyral resins. The insulation layer 404 may be made of a various organic resin films such as a nylon film, an aluminum-laminated Tedlar film, and the like. In this example, the light-transmissive thermoplastic organic resin 402 serves as an adhesive for bonding the photovoltaic element 403 with the fluoroplastic film 401 and the insulation layer 404, and also serves as a filler for protecting the solar cell from external scratching and impact.

However, the aforementioned thermoplastic light-transmissive organic resins, especially EVA, are not sufficient in heat resistance and water resistance. Therefore, the solar cell modules which have EVA and the above fluoroplastics for surface layers involve problems as noted below.

On exposure of the solar cell module to direct sunlight, the surface of the module is heated to a temperature of higher than 65° C. The EVA used for sealing the solar cell module is liable to be deformed at such a high temperature, since the EVA resin has a Vicat softening point of 40° C. or lower. This problem is more serious when the solar cell module is used in integration with a building material such as a roof material.

The photovoltaic element having a thin semiconductor film formed on a electroconductive metal substrate is liable to cause short-circuit (or shunting) between the substrate and the light-transmissive electroconductive layer owing to unevenness of the substrate or non-uniformity of the formed film. Although the shunting can be eliminated by defect-removal treatment, the treated element tends to cause shunting again latently. This recurrence of the shunting is accelerated by presence of moisture.

The fluoroplastic resin constituting the outermost layer of the solar cell module does not efficiently serve as a moisture barrier. Further, sealing of the photovoltaic element with a highly hygroscopic EVA resin is not desirable in ensuring the long-term stability of the solar cell module under high temperature and high humidity conditions. Furthermore, the EVA resin may possibly be hydrolyzed at the acetate group therein in the presence of moisture to liberate acetic acid which accelerates the shunting of the photovoltaic element or causes corrosion of the light-transmissive electroconductive surface.

Japanese Patent Publication No. 62-9232 discloses an adhesive filler sheet material for solar cells, which is composed of a mixture of a silane-modified ethylene copolymer and an organic peroxide. Japanese Patent Publication No. 62-14111 discloses an adhesive filler sheet material for solar cells, which is composed of an ethylene copolymer containing therein a coupling agent and an organic peroxide.

However, the above Japanese Patent Publications do not describe at all the solar cell element which is prepared by covering a defect-removal-treated element with an EVA resin and a fluoroplastic resin on the light-incident side of the element. Further the Japanese Patent Publications do not describe the low heat resistance and high hygroscopicity of the EVA resin or liberation of an acid from the EVA resin, and do not mention the difference between EVA resins and other ethylene type copolymers. Therefore, use of ethylene type copolymers other than EVA is worthy of investigation.

SUMMARY OF THE INVENTION

The present invention intends to provide a light-transmissive resin sealed semiconductor which is sealed at least at a light-incident face of a photoelectric transducer such as a photovoltaic element, a photosensor and the like with an organic polymer resin layer, the organic resin layer comprising a copolymer of ethylene and an unsaturated fatty acid ester.

The present invention intends to provide a light-transmissive resin sealed semiconductor for a solar cell which is provided with a surface covering material having high heat resistance and low hygroscopicity, not liberating a free acid even in the presence of moisture, deforming less at a high temperature, minimizing deterioration of solar cell performance caused by fall of shunt resistance of photovoltaic element at a high humidity.

DETAILED DESCRIPTION OF THE PREFERRED EMBODIMENT

The light-transmissive resin sealed semiconductor of the present invention is sealed at a light-incident face of a photoelectric transducer with an organic polymer resin layer, wherein the organic resin layer comprises a copolymer of ethylene and an unsaturated fatty acid ester. The organic polymer resin layer comprising a copolymer of ethylene and an unsaturated fatty acid ester as the surface covering material gives the effects below.

(1) The covering layer is heat-resistant, not causing deformation and exfoliation by softening of the filler in use at a high temperature.

(2) The covering layer is humidity-resistant, preventing penetration of moisture therein, suppressing liberation of an acid, and decreasing inherently the adverse effect of moisture to the photovoltaic element.

(3) The covering layer, when it is applied to a photovoltaic element having been treated for defect removal to repair the shunt portion, prevents drop of shunt resistance which is liable to be caused by water and a liberated acid in the defect-removal-treated photovoltaic element, thereby retarding the drop of performance of the solar cell by humidity.

Figure 1:
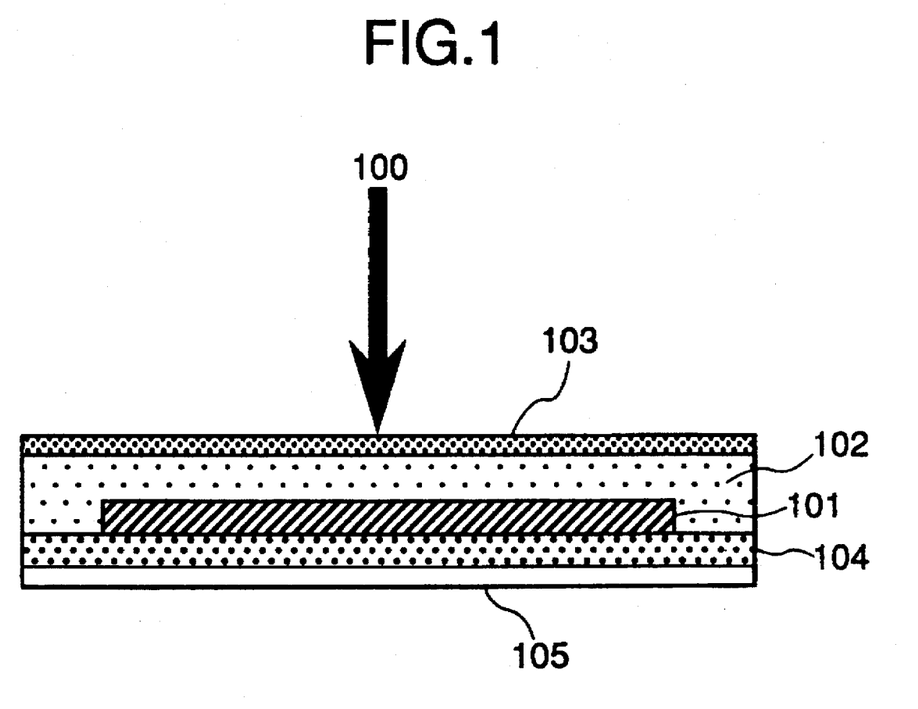
FIG. 1 is a schematic sectional view of a light-transmissive resin sealed semiconductor of the present invention such as a solar cell module.

With reference to FIG. 1, the structure of a solar cell module as an example of the light-transmissive resin sealed semiconductor of the present invention will be described below. External light 100 is introduced through an outermost surface film 103 to a photovoltaic element 101. The electromotive force generated by the photovoltaic element 101 is taken out through an output terminal (not shown in the drawing).

Photoelectric Transducer 101

The photovoltaic element 101 of the present invention which is a photoelectric transducer comprises a photoactive semiconductor layer as the photovoltaic member formed, for example, on an electroconductive substrate. An example of the construction thereof is shown schematically in FIGS. 2A and 2B, being constituted of an electroconductive substrate 201, a backside reflection layer 202, a photoactive semiconductor layer 203, a light-transmissive electroconductive layer 204, and a collecting electrode 205.

Electroconductive Substrate 201

Figure 2A:
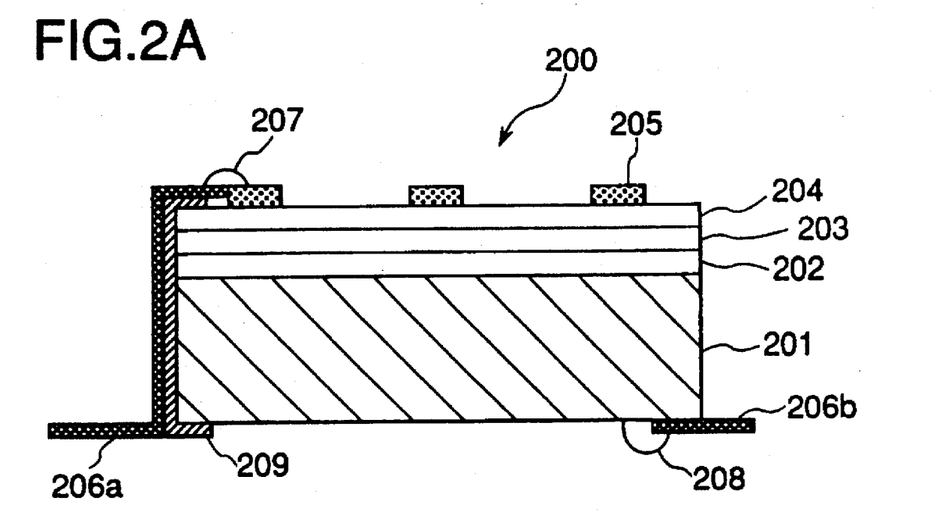
FIG. 2A is a schematic sectional view of a photoelectric transducer for the solar cell module as shown in FIG. 1.

The electroconductive substrate 201 serves as a base material for the photovoltaic element 101 as well as a lower electrode. The constituting material thereof includes silicon, tantalum, molybdenum, tungsten, stainless steel, aluminum, copper, titanium, carbon sheet, lead-plated steel, and resins, ceramics, and glass having an electroconductive layer thereon. On the above electroconductive substrate 201, a backside reflection layer 202 may be formed from a metal layer, a metal oxide layer, or lamination thereof. The metal layer may be formed from Ti, Cr, Mo, W, Al, Ag, Ni, or the like. The metal oxide layer may be formed from $ZnO$, $TiO_2$, $SnO_2$, $In_2O_3$—$SnO_2$ (ITO), or the like. The metal layer and the metal oxide layer may be formed by resistance heating vapor deposition, electron beam vapor deposition, sputtering, or the like method.

Photoactive Semiconductor Layer 203

The photoactive semiconductor layer 203 conducts photoelectric conversion. The specific materials therefor include pn junction type polycrystalline silicon, pin conjunction type amorphous silicon, and compound semiconductor such as $CuInSe_2$, $CuInS_2$, GaAs, $CdS/Cu_2S$, CdS/CdTe, CdS/InP, and $CdTe/Cu_2Te$. The polycrystalline silicon type photoactive semiconductor layer may be formed by a process such as sheet formation from molten silicon, and heat treatment of amorphous silicon. The amorphous silicon type photoactive semiconductor layer may be formed by plasma CVD using a silane gas. The compound semiconductor type photoactive semiconductor layer may be formed by ion plating, ion beam deposition, vacuum vapor deposition, sputtering, electrodeposition, or the like method.

Light-Transmissive Electroconductive Layer 204

The light-transmissive electroconductive layer 204 is employed for a solar cell having higher electric resistance, and serves as an upper electrode. The specific example of the material therefor include $In_2O_3$, $SnO_2$, $In_2O_3$—$SnO_2$ (ITO), $ZnO$, $TiO_2$, $Cd_2SnO_4$, crystalline semiconductor layers doped with a high concentration of impurity, and metal thin films having ohmic junction with a semiconductor. The light-transmissive electroconductive layer 204 may be formed by resistance-heating vapor deposition, sputtering, spraying, CVD, impurity diffusion, or the like methods.

The photovoltaic element built up to have a light-transmissive layer has local short circuit between the electroconductive substrate and the light-transmissive electroconductive layer owing to the unevenness of the electroconductive substrate and/or the formed photoactive semiconductor layer. That is, the photovoltaic element has a low leakage resistance (shunt resistance). There, current leakage occurs in proportion to the output voltage. To repair this, the element after formation of the light-transmissive electroconductive layer is subjected to defect removal treatment. This treatment is described in detail in U.S. Pat. No. 4,729,970. By this treatment, the shunt resistance of the photovoltaic element is controlled to be in the range of from 1 to 500 $K\Omega \cdot cm^2$, preferably from 10 to 500 $K\Omega \cdot cm^2$.

Collecting Electrode 205

Figure 2B:
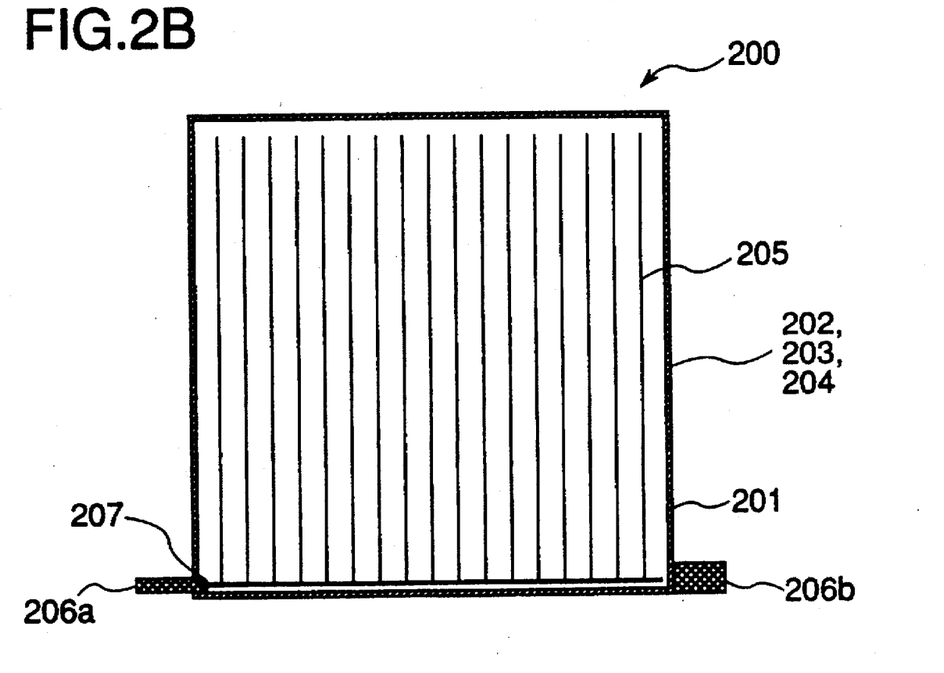
FIG. 2B is a plan view of light-incident side of the element.

On the light-transmissive electroconductive layer 204, a grid type collecting electrode 205 (grid) may be provided. The specific examples of the material for the collecting electrode 205 include Ti, Cr, Mo, W, Al, Ag, Ni, Cu, and Sn, and electroconductive paste such as silver paste. The collecting electrode 205 may be formed by sputtering, resistance heating, and CVD employing a mask pattern; entire metal film deposition and subsequent etching at unnecessary parts with patterning; direct grid electrode pattern formation by photo-assisted CVD; formation of a negative pattern mask of the grid electrode and subsequent metal plating; printing with electroconductive paste; bonding of a metal wire to a printed electroconductive paste portion by soldering, or the like method.

The electroconductive paste includes a dispersion of powder of silver, gold, copper, nickel, carbon or the like in a binder polymer. The binder polymer includes polyester resins, epoxy resins, acrylic resins, alkyd resins, polyvinyl acetate resins, rubbers, urethane resins, and phenol resins.

Output Terminal 206

Finally, output terminals 206a, 206b for taking out the electromotive force are bonded respectively to the electroconductive substrate 201 and to the collecting electrode 205. To the electroconductive substrate 201, a metal article such as copper tab is bonded by spot welding or soldering. To the collecting electrode 205, a metal article is jointed electrically with electroconductive paste or solder.

The photovoltaic elements 101 prepared by the above procedure may be connected in series or in parallel to obtain the desired voltage or current intensity. Otherwise, the photovoltaic elements may be integrated on the insulated substrate to obtain a desired voltage or current intensity.

Back Face Covering Film 105

The back face covering film 105 insulates electrically the electroconductive substrate 201 of the photovoltaic element 101 from the outside. The material therefor is desired to have sufficient electrical insulation property for the electroconductive substrate 201, sufficient durability for a long-term use, endurance to thermal expansion and thermal constriction, and flexibility. Specific examples for the back face covering film are films of nylon, and polyethylene terephthalate.

Backside Filler 104

The backside filler 104 bonds the back face covering film 105 to the photovoltaic element 101. The material for the backside filler 104 is desired to have sufficient bonding properties, sufficient long-term durability, endurance to thermal expansion and thermal constriction, and flexibility. Specific examples therefor include hot-melt adhesives such as EVA, and polyvinylbutyral, double-side coated tapes, and flexible epoxy adhesives. This backside filler 104 may be made of the same material as the front side filler 102 described later.

In the case where the solar cell module is used at a high temperature, for example, in integration with a building material like a roof material, the filler is preferably crosslinked in order to ensure the adhesion at the high temperature. The crosslinking of the material like EVA is conducted generally with an organic peroxide.

A reinforcing plate may be attached to the external surface of the back face covering film 105 to increase the mechanical strength or to prevent distortion and warpage of the solar cell module due to temperature change. The reinforcing plate is suitably made of a steel plate, a plastic plate, FRP (glass fiber reinforced plastics), or the like.

Filler 102

The filler 102 as used in the present invention is explained below in detail. The filler is a resin employed to cover the surface roughness of the photovoltaic element and to protect the photovoltaic element from the external environment. When a surface film is provided, the filler serves to bond the surface film to the photovoltaic element. Therefore, the filler is required to have weatherability, adhesiveness, heat resistance in addition to the high transmissivity, and further low hygroscopicity, and not to liberate an acid. These requirements are suitably satisfied by copolymer resins of ethylene and an unsaturated aliphatic carboxylic acid (fatty acid), specifically including ethylene-methyl acrylate copolymers (EMA), ethylene-ethyl acrylate copolymers (EEA), ethylene-butyl acrylate copolymers (EBA), ethylene-methyl methacrylate copolymers (EMM), and ethylene-ethyl methacrylate copolymers (EEM). Of these ethylene-unsaturated aliphatic carboxylic acids, EMA and EEA are suitable from availability and cost, and EEA is more suitable from light transmissivity.

The resin constituting the filler is desirably crosslinked for improvement of heat resistance and adhesiveness. The crosslinking is conducted generally by use of crosslinking agent such as a isocyanate, melamine, and an organic peroxide. The crosslinking agent employed in the present invention is desired to have a sufficiently long pot life, to cause rapid crosslinking reaction, and to release little or no substance.

Organic peroxides satisfy the above requirements. The organic peroxides are described in detail. The crosslinking reaction by an organic peroxide proceeds through abstraction of hydrogen atoms from the resin molecules by free radicals generated from the organic peroxide to form carbon-carbon bonds. The organic peroxide is activated by thermal decomposition, redox decomposition, or ionic decomposition. Generally, thermal decomposition is preferred.

The organic peroxide is classified, according to the chemical structure, into hydroperoxides, dialkyl (aryl) peroxides, diacyl peroxides, peroxyketals, peroxyesters, peroxycarbonates, and ketone peroxides.

The hydroperoxides include t-butyl hydroperoxide, 1,1,3,3-tetramethylbutyl hydroperoxide, p-menthane hydroperoxide, cumeme hydroperoxide, p-cymeme hydroperoxide, diisopropylbenzene hydroperoxide, 2,5-dimethylhexane-2,5-dihydroperoxide, cyclohexane hydroperoxide, and 3,3,5-trimethylhexanone hydroperoxide.

The dialkyl (aryl) peroxides include di-t-butyl peroxide, dicumyl peroxide, and t-butyl cumyl peroxide.

The diacyl peroxides include diacetyl peroxide, dipropionyl peroxide, diisobutyryl peroxide, dioctanoyl peroxide, didecanoyl peroxide, dilauroyl peroxide, bis(3,3,5-trimethylhexanoyl) peroxide, benzoyl peroxide, m-tolyl peroxide, p-chlorobenzoyl peroxide, 2,4-dichlorobenzoyl peroxide, and peroxysuccinic acid.

The peroxyketals include 2,2-di-t-butylperoxybutane, 1,1-di-t-butylperoxycyclohexane, 1,1-di-(t-butylperoxy)-3,3,5-trimethylcyclohexane, 2,5-dimethyl-2,5-di-(t-butylperoxy)hexane, 2,5-dimethyl-2,5-di(t-butylperoxy)hexyne-3, 1,3-di(t-butylperoxyisopropyl)benzene, 2,5-dimethyl-2,5-dibenzoylperoxyhexane, 2,5-dimethyl-2,5-di(peroxybenzoyl)hexyne-3, and n-butyl-4,4-bis(t-butylperoxy) valerate.

The peroxyesters include t-butylperoxy acetate, t-butylperoxy isobutyrate, t-butylperoxy pivalate, t-butylperoxy neodecanoate, t-butylperoxy 3,3,5-trimethylhexanoate, t-butylperoxy 2-ethylhexanoate, (1,1,3,3-tetramethylbutylperoxy) 2-ethylhexanoate, t-butylperoxy laurate, t-butylperoxy benzoate, di(t-butylperoxy) adipate, 2,5-dimethyl-2,5-di(peroxy-2-ethylhexanoyl)hexane, di(t-butylperoxy) isophthalate, t-butylperoxy maleate, and acetylcyclohexylsulfonyl peroxide.

The peroxycarbonates include t-butylperoxy isopropyl carbonate, di-n-propylperoxy dicarbonate, di-sec-butylperoxy carbonate, di(isopropylperoxy) dicarbonate, di(2-ethylhexylperoxy) dicarbonate, di(2-ethoxyethylperoxy) dicarbonate, di(methoxyisopropylperoxy) carbonate, di(3-methoxybutylperoxy) dicarbonate, and bis(4-t-butylcyclohexylperoxy) dicarbonate.

The ketone peroxides include acetylacetone peroxide, methyl ethyl ketone peroxide, methyl isobutyl ketone peroxide, and ketone peroxide.

Furthermore, vinyl-tris(t-butylperoxy)silane and the like are known as the useful peroxide.

The organic peroxide is used preferably in an amount of 0.1% to 5% by weight based on the filler material. The filler can be crosslinked and simultaneously be heat-bonded to the solar cell module by pressing and heating a mixture of an organic peroxide and the filler material. The heating temperature and the heating time depend on the thermal decomposition characteristics of the organic peroxide. Generally, the temperature and the time of the heat bonding are selected such that 90% or more, preferably 95% or more of the organic peroxy compound is decomposed. The pressing is conducted by use of a heated roll or a heated press, or by evacuating the system by use of a jig of an air bag shape to press with the atmospheric pressure. As a crosslinking aid, triallylcyanurate is preferably used for conducting the crosslinking reaction effectively, generally in an amount of from 0.1% to 5% by weight of the filler.

To the filler resin, a thermal oxidation inhibitor is frequently added to stabilize the resin at high temperature, suitably in an amount of 0.1 to 1 part by weight based on 100 parts by weight of the resin. The thermal oxidation inhibitor is classified into monophenol types, bisphenol types, polymeric phenol types, sulfur types, and phosphite types.

The monophenol types of inhibitors include 2,6-di-t-butyl-p-cresol, butylated hydroxyanisol, and 2,6-di-t-butyl-4-ethylphenol.

The bisphenol types of inhibitors include 2,2'-methylene-bis(4-methyl-6-t-butylphenol), 2,2'-methylene-bis(4-ethyl-6-t-butylphenol), 4,4'-thio-bis(3-methyl-6-t-butylphenol), 4,4'-butylidene-bis(3-methyl-6-t-butylphenol), and 3,9-bis[1,1-dimethyl-2-[β-(3-t-butyl-4-hydroxy-5-methylphenyl)propionyloxyethyl]-2,4,8,10-tetraoxaspiro]-5,5-undecane.

The polymeric phenol types of inhibitors include 1,1,3-tris(2-methyl-4-hydroxy-5-t-butylphenyl)butane, 1,3,5-trimethyl-2,4,6-tris(3,5-di-t-butyl-4-hydroxybenzyl)benzene, tetrakis[methylene-3-(3',5'-di-t-butyl-4'-hydroxyphenyl)propionato]methane, bis(3,3'-bis-4'-hydroxy-3'-t-butylphenyl)butyric acid/glycol ester, 1,3,5-tris(3',5'-di-t-butyl-4'-hydroxybenzyl)-s-triazine-2,4-6-(1H,3H,5H)trione, and tocopherol (vitamin E).

The sulfur types of inhibitors include dilaurylthio dipropionate, dimyristylthio dipropionate, and distearylthio propionate.

The phosphite types of inhibitors include triphenyl phosphite, diphenyl isodecyl phosphite, phenyl diisodecyl phosphite, 4,4'-butylidene-bis-(3-methyl-6-t-butylphenyl-ditridecyl) phosphite, cyclic neopentanetetrayl-bis(octadecyl phosphite), tris(mono- and/or di-phenyl phosphite), diisodecyl pentaerythritol diphosphite, 9,10-dihydro-9-oxa-10-phosphaphenanthrene-10-oxide, 10-(3,5-di-t-butyl-4-hydroxybenzyl-9,10-dihydro-9-oxa-10-phosphaphenanthrene-10-oxide, 10-decyloxy-9,10-dihydro-9-oxa-10-phosphaphenanthrene, cyclic neopentanetetrayl-bis(2,4-di-t-butylphenyl) phosphite, cyclic neopentanetetrayl-bis(2,6-di-t-butylphenyl) phosphite, and 2,2-methylene-bis(4,6-t-butylphenyl) octyl phosphite.

Further, an ultraviolet absorber is preferably added the filler resin to prevent the photodeterioration and improve the weatherability thereof. The ultraviolet absorber is used in an amount of from 0.1 to 0.5 part by weight based on 100 parts of the resin. The ultraviolet absorbers are known, and are classified into salicylate types, benzophenone types, benzotriazole types, and cyanoacrylate types according to the chemical structure.

The salicylate type ultraviolet absorbers include phenyl salicylate, p-t-butylphenyl salicylate, and p-octylphenyl salicylate.

The benzophenone type ultraviolet absorbers include 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone, 2-hydroxy-4-methoxy-5-sulfobenzophenone, and bis(2-methoxy-4-hydroxy-5-benzophenone)methane.

The benzotriazole type ultraviolet absorbers include 2-(2'-hydroxy-5'-methylphenyl)benzotriazole, 2-(2'-hydroxy-5'-t-butylphenyl)benzotriazole, 2-(2'-hydroxy-3',5'-di-t-butylphenyl)benzotriazole, 2-(2'-hydroxy-3'-t-butyl-5-methylphenyl)-5-chlorobenzotriazole, 2-(2'-hydroxy-3',5'-di-t-butylphenyl)-5-chlorobenzotriazole, 2-(2'-hydroxy-3',5'-di-t-amylphenyl)benzotriazole, 2-[2'-hydroxy-3'-(3'',4'',5'',6''-tetrahydrophthalimido-methyl)-5'-methylphenyl]benzotriazole, and 2,2-methylene-bis[4-(1,1,3,3-tetramethylbutyl)-6-(2H-benzotriazol-2-yl)phenol].

The cyanoacrylate type ultraviolet absorbers include 2-ethylhexyl 2-cyano-3,3'-diphenylacrylate, and ethyl 2-cyano-3,3'-diphenylacrylate.

One or more of the above ultraviolet absorber are preferably added to the filler resin.

The weatherability can also be improved by addition of a hindered amine type photostabilizers. The hindered amine photostabilizer does not absorb ultraviolet light as the ultraviolet absorber, but exhibits, in combination with the ultraviolet absorber, remarkable synergistic effects for improvement of the weatherability. The photostabilizer is preferably used in an amount of 0.1 to 0.3 part by weight based on 100 parts by weight of the resin. Photostabilizers other than the hindered amines are generally colored, therefore is not suitable for stabilizing the filler of the present invention.

The hindered amine type photostabilizers include a polycondensate of dimethyl succinate with 1-(2-hydroxyethyl)-4-hydroxy-2,2,6,6-tetramethylpiperidine, poly[{6-(1,1,3,3-tetramethylbutyl)amino-1,3,5-triazin-2,4-diyl}{(2,2,6,6-tetramethyl-4-piperidyl)imino}-hexamethylene{(2,2,6,6-tetramethyl-4-piperidyl)imino}], N,N'-bis(3-aminopropyl) ethylenediamine-2,4-bis[N-butyl-N-(1,2,2,6,6-pentamethyl-4-piperidyl)amino]-6-chloro-1,3,5-triazine condensate, bis (2,2,6,6-tetramethyl-4-piperidyl) sebacate, bis (1,2,2,6,6-pentamethyl-4-piperidyl) 2-(3,5-di-t-butyl-4-hydroxybenzyl)-2-n-butylmalonate.

The ultraviolet absorber, the photostabilizer, and the thermal oxidation inhibitor are desired to be low-volatile in consideration of the working environment of the solar cell module.

If more severe working conditions are expected for the solar cell module, the adhesiveness of the filler material to the photovoltaic element and the surface film is preferably raised. The adhesiveness can be improved by addition of a silane coupling agent or an organic titanate to the filler material. The silane coupling agent includes vinyltrichlorosilane, vinyl-tris(β-methoxyethoxy)silane, vinyltriethoxysilane, vinyltrimethoxysilane, γ-methacryloxypropyltrimethoxysilane, β-(3,4-epoxycyclohexyl)ethyltrimethoxysilane, γ-glycidoxypropylmethyldiethoxysilane, N-β(aminoethyl)-γ-aminopropyltrimethoxysilane, N-β(aminoethyl)-γ-aminopropylmethyldimethoxysilane, γ-aminopropyltriethoxysilane, N-phenyl-γ-aminopropyltrimethoxysilane, γ-mercaptopropyltrimethoxysilane, γ-chloropropyltrimethoxysilane, and the like.

In order to introduce a sufficient quantity of light to the photovoltaic element, the light transmissivity of the filler resin is desirably not less than 80%, more preferably not less than 90% in the wavelength range of from 400 nm to 800 nm. Further, in order to facilitate the introduction of light from the outside, the refractive index of the filler is preferably in the range of from 1.1 to 2.0, more preferably from 1.1 to 1.6.

The surface film 103, which is the outermost layer of the solar cell module, should have weatherability, water repellency, resistance to soiling, mechanical strength, and other properties to ensure reliability in long term outdoor exposure of the solar cell module. The suitable material for the surface film includes tetrafluoroethylene-ethylene copolymer resins (ETFE), polyvinyl fluoride resins (PVF), polyvinylidene fluoride resins (PVDF), polytetrafluoroethylene resins (TFE), tetrafluoroethylene-hexafluoropropylene copolymers (FEP), and polytrifluorochloroethylene resins (CTFE). From weatherability, polyvinylidene fluoride resins are suitable. From weatherability and mechanical strength, tetrafluoroethylene-ethylene copolymers are particularly suitable.

The surface film is preferably subjected to corona treatment of plasma treatment for improvement of the adhesiveness to the filler material. The surface film may be stretched for improvement of the mechanical strength.

The process for producing a solar cell module will be described in which the photovoltaic element, the filler resin, the surface film and the back face covering material mentioned above are used.

The resin of the filler 102 is applied at least on the light-incident face of the photovoltaic element by any of methods of application of a solution of the filler material and evaporation of the solvent; uniform application of a powdery filler on the surface of the photovoltaic element and heat fusion of the powdery filler; extrusion of a heat-melted filler material through a slit onto the element; formation of a filler material sheet by heat extrusion molding and press bonding it on the photovoltaic element; and the like methods.

When the filler is applied as a solution, the additives such as silane coupling agent, ultraviolet absorber, and antioxidant are simultaneously dissolved therein. When the filler material is applied by melt fusion of a powdery material or when the filler material is melt-extruded, the additives also need to be preliminarily mixed.

In the case where a preliminarily formed filler material film is used, the backside filler layer 104, the back face covering film 105, the photovoltaic element, the filler material film, and the surface film 103 are laid in the named order, and the layered matter is heat-press bonded to produce a solar cell module. A reinforcing plate, if it is provided, is press bonded to the back face covering film with interposition of an adhesive. This may be conducted either before or after the above production steps.

In the case where the filler material is formed in a sheet shape, the filler material sheet is interposed between the photovoltaic cell element and the surface film, and heat-press bonded in the same manner as above to produce a solar cell module.

The heat-press bonding may also be conducted by vacuum lamination, roll lamination, or a like method.

The present invention is described below in more detail by reference to Examples.

EXAMPLE 1

Photovoltaic Element

An amorphous silicon (a-Si) solar cell (a photovoltaic element) was produced. The production steps are described by reference to FIGS. 2A and 2B.

On a cleaned stainless steel substrate 201, an Al layer of 5000 Å thick and a ZnO layer of 5000 Å thick were formed successively as the backside reflection layer 202 by sputtering. Then, by plasma CVD, an n-type a-Si layer was formed by use of a gas mixture of $SiH_4$, $PH_3$, and $H_2$; an i-type a-Si layer was formed from a gas mixture of $SiH_4$, and $H_2$; and a p-type micro-crystalline silicon (µc-Si) layer was formed from a gas mixture of $SiH_4$, $BF_3$, and $H_2$. Thus the photoactive Semiconductor layer 203 of a tandem type a-Si photovoltaic semiconductor layer was formed which is constituted of an n-type layer of 150 Å thick, an i-type layer of 4000 Å thick, a p-type layer of 100 Å thick, an n-type layer of 100 Å thick, an i-type layer of 800 Å thick, and a p-type layer of 100 Å thick, arranged in the named order.

Thereon, a thin $In_2O_3$ film of 700 Å thick was formed as the light-transmissive electroconductive layer 204 by vapor deposition of In by resistance heating in an $O_2$ atmosphere.

Thereafter the photovoltaic element was treated for defect removal treatment as follows. The photovoltaic element was immersed in a aqueous aluminum chloride solution having a conductivity adjusted in the range of from 50 to 70 mS with an electrode plate opposing to the light-transmissive electroconductive layer of the photovoltaic element. A positive potential of 3.5 V was applied to the electrode plate for two seconds with the photovoltaic element grounded to decompose selectively the light-transmissive electroconductive layer at shunting portion. This treatment improved the shunt resistance of the photovoltaic element from 1 to 10 $k\Omega \cdot cm^2$ before the treatment to 50 to 200 $k\Omega \cdot m^2$ after the treatment.

Further, a collecting electrode 205 for current collection was formed by screen-printing a copper paste line of 200 µm wide and fixing a copper wire with a cream solder. A copper tab as the negative terminal 206b was bonded to the stainless steel substrate 201 with stainless steel solder 208. A tin foil tape as the positive terminal 206a was bonded to the current-collecting electrode 205 by use of an electroconductive adhesive or a solder 207. Thus a photovoltaic element was completed.

The solar cell module was prepared in the production steps described below by reference to FIG. 3.

Covering Materials

A filler material composition for the filler 302 was prepared by mixing 100 parts by weight of pelletized EEA resin (ethylene-ethyl acrylate copolymer, ethyl acrylate unit content: 25% by weight), 3 parts by weight of 2,5-dimethyl-2, 5-bis(t-butylperoxy)hexane as the crosslinking agent, 0.3 part by weight of γ-methacryloxypropyltrimethoxysilane as the silane coupling agent, 0.3 part by weight of 2-hydroxy-4-n-octoxybenzophenone as the ultraviolet absorber, 0.1 part by weight of bis(2,2,6,6-tetramethyl-4-piperidyl) sebacate as the light stabilizer, and 0.2 part by weight of tris (nonylphenyl) phosphite as the antioxidant. This composition was formed into a sheet (hereinafter referred to as EEA sheet) of 400 µm thick by heat-melting the composition at a low temperature of 80° to 100° C. to avoid thermal decomposition of the crosslinking agent and extruding it through a T-die slit. This EEA sheet was used as the filler 302.

The surface film 303 was an ETFE film (trade name Tefzel T2 film, monoaxially stretched, 38 µm thick, produced by DuPont Co.) which had been treated by corona discharge at the face for adhesion to the underlying organic polymer resin film.

The back face covering film 304 was an aluminum-laminated Tedler film of 120 µm thick (produced by Tokai Aluminum Foil K.K.).

The reinforcing plate 305 was a galvernized steel plate (zinc-plated steel plate) of 0.3 mm thick.

Lamination

Figure 3:
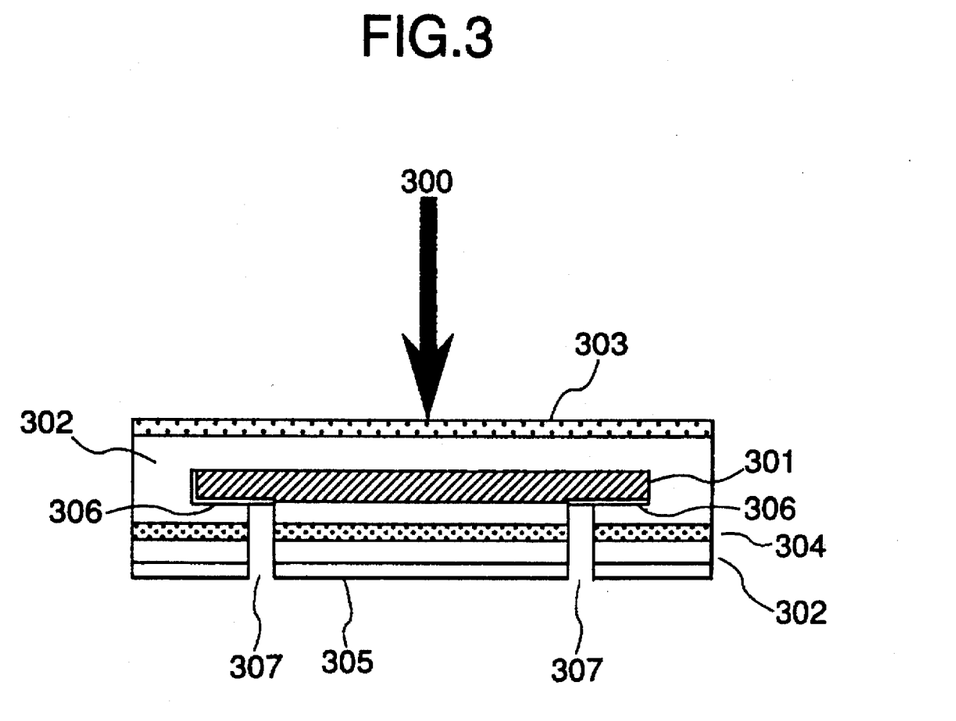
FIG. 3 is a schematic sectional view of the solar cell module of Example 1.

The aforementioned photovoltaic element was laminated with the above covering materials to obtain the construction shown in FIG. 3. The EEA sheet and the surface film were overlaid on the light-incident face of the photovoltaic element, and the EEA sheet, the aluminum-laminated Tedler film, and the reinforcing plate were overlaid on the reversed face of the photovoltaic element, and the layered matter was heated by means of a vacuum laminating apparatus with pressurization and deaeration at 150° C. for 30 minutes. The output terminal 306 was provided at the back side of the photovoltaic element, so that the output could be taken out through output openings 307 formed preliminarily through the galvernized steel plate.

Thus the solar cell module of the present invention was prepared.

EXAMPLE 2

A solar cell module was prepared in the same manner as in Example 1 except that the EEA resin contained ethyl acrylate units at a content of 19% by weight.

EXAMPLE 3

A solar cell module was prepared in the same manner as in Example 1 except that the EEA resin contained ethyl acrylate units at a content of 35% by weight.

EXAMPLE 4

A solar cell module was prepared in the same manner as in Example 1 except that an EMA resin (ethylene-methyl acrylate copolymer) was used in place of the EEA resin.

EXAMPLE 5

A solar cell module was prepared in the same manner as in Example 1 except that the EEA sheet was prepared without use of the crosslinking agent, and the heating time for the vacuum lamination was shortened to minutes since crosslinking was not conducted.

Comparative Example 1

A solar cell module was prepared in the same manner as in Example 1 except that the filler sheet was prepared from an EVA resin (vinyl acetate unit content: 33% by weight, trade name: Evaflex 150, produced by Mitsui DuPont Polychemical Co.) in place of the EEA resin.

Comparative Example 2

A solar cell module was prepared in the same manner as in Comparative Example 1 except that an EVA resin (vinyl acetate unit content: 28% by weight, trade name: Evaflex 250, produced by Mitsui DuPont Polychemical Co.) was used in place of the EVA in Comparative Example 1.

Comparative Example 3

A solar cell module was prepared in the same manner as in Example 5 except that the EEA resin was replaced by the EVA resin used in Comparative Example 1.

Evaluation Method

The solar cell modules obtained in Example 1–5, and Comparative Example 1–3 were evaluated for the items below. Table 1 shows the results of the evaluation.

(1) Heat resistance:

The solar cell module was kept standing in an atmosphere of 100° C. for 24 hours. The ones which did not change the appearance was evaluated to be "good".

(2) Initial conversion efficiency:

The solar cell modules immediately after it was prepared was subjected to measurement of the photoelectric conversion efficiency under irradiation of AM 1.5, light intensity of 5,100 mW/cm$^2$.

(3) Humidity resistance:

The solar cell module was kept standing in an atmosphere of 85° C. and 85% RH for 24 hours under irradiation with simulated sunlight of AM 1.5 and 100 mW/cm$^2$. The conversion efficiency of the solar cell module was measured before and after the above exposure treatment with light irradiation of AM 1.5, and 100 mW/cm$^2$. The measurement was conducted with 10 modules, and the average of the relative drop ratio of the conversion efficiency was calculated. Additionally, the shunt resistance in the dark state was measured of 10 modules, and the average shunt resistance was calculated.

Table 1 shows that the solar cells covered with the EEA resin did not deform at all, exhibiting excellent heat resistance. In particular, in Example 5 and Comparative Example 3 in which the resins were not crosslinked, the EEA resin was effective in comparison with the EVA resin because of the higher softening point of the EEA resin.

The initial conversion efficiency of the module coated with the EMA was slightly low. This is caused by the slightly lower light-transmissivity of EMA than that of the EEA and EVA. EEA gave the same efficiency as EVA, showing no problem in light-transmissivity of the resin.

In the humidity resistance evaluation, the deterioration of the conversion efficiency of the modules in Examples was remarkably less than in Comparative Examples. This is due to the fact that the drop of the shunt resistance in case of using EEA resin is less than that in the case where EVA is used for the covering. The two reasons are considered below.

The one reason is the difference in hygroscopicity of the resins. Specifically, the EEA resin employed in Example 1 has hygroscopicity of 420 ppm at 40° C., 90% RH, whereas the EVA resin has hygroscopicity of 1860 ppm under the same conditions, which is more than four times that of the EEA resin. The hygroscopicity depends the content of the comonomer unit in the same type resin. However, EEA is less hydroscopic than EVA. The drop of the shunt resistance is considered to be due to ionization of metal such as the collecting electrode provided on the surface of the element and subsequent deposition of the metal. In this ionization-deposition mechanism, water is indispensable. Accordingly, the higher the hygroscopicity of the covering resin of the photovoltaic element, the more would the ionization be accelerated to cause drop of the shunt resistance.

The other reason is the liberation of an acid from the resin. The EVA resin liberates acetic acid by hydrolysis of the acetate Group, which accelerates the aforementioned ionization. On the other hand, the EEA resins and the EMA resins do not cause the acid liberation, which retards the ionization in combination with the low hygroscopicity, in comparison with the EVA resin.

The solar cell module of the present invention is not limited by the above Examples, but may naturally be modified within the gist of the invention.

The solar cell module of the present invention is sealed at least at a light-incident face with at least one layer of light-transmissive organic polymer resin which is a copolymer of ethylene with an unsaturated fatty acid ester.

Therefore, the surface covering material of the solar cell module is prevented from deformation or peeling at a high temperature when the solar cell module is exposed to direct sunlight irradiation. Further, the penetration of water into the organic polymer resin is less and acid liberation is not liable to occur in the covering material, so that the adverse effect of the moisture on the element is reduced, and the photovoltaic element having been treated for defect removal is prevented decrease in the performance caused by humidity.

TABLE 1

| | | | Humidity resistance | | |
|---|---|---|---|---|---|
| | | | Relative | Shunt resistance $(k\Omega \cdot cm^2)$ | |
| | | Initial | drop ratio | | |
| | Heat resistance | conversion efficiency | of conversion efficiency | Before test | After test |
| Example | | | | | |
| 1 | Good | 7.6% | 7% | 120 | 15 |
| 2 | Good | 7.6% | 5% | 90 | 23 |
| 3 | Good | 7.5% | 10% | 105 | 8 |
| 4 | Good | 7.3% | 8% | 110 | 12 |
| 5 | Good | 7.6% | 8% | 90 | 11 |
| Comparative Example | | | | | |
| 1 | Good | 7.6% | 23% | 105 | 1.3 |
| 2 | Good | 7.5% | 17% | 90 | 3.7 |
| 3 | Remarkably deformed | 7.6% | 25% | 115 | 0.8 |

What is claimed is:

1. A light-transmissive resin sealed semiconductor which is sealed at least at a light-incident face of a photoelectric transducer with an organic polymer resin layer, wherein the organic resin layer comprises
at least one copolymer selected from the group consisting of ethylene-methyl acrylate, ethylene-ethyl acrylate, ethylene-butyl acrylate, ethylene-methyl methacrylate and ethylene-ethyl methacrylate.

2. A light-transmissive resin sealed semiconductor according to claim 1, wherein the photoelectric transducer comprises an electroconductive substrate as a first electrode, a photoactive semiconductor layer as a photovoltaic member formed thereon, and a light-transmissive electroconductive layer formed further thereon as a second electrode.

3. A light-transmissive resin sealed semiconductor according to claim 1, wherein the photoelectric transducer has a photoactive semiconductor layer comprising a non-monocrystalline semiconductor.

4. A light-transmissive resin sealed semiconductor according to claim 3, wherein the non-monocrystalline semiconductor comprises amorphous silicon.

5. A light-transmissive resin sealed semiconductor according to claim 1, wherein the copolymer is methyl acrylate or ethyl acrylate.

6. A light-transmissive resin sealed semiconductor according to claim 1, wherein the photoelectric transducer is treated for removal of a short-circuited portion of the photoelectric transducer so as to repair the short-circuited portion.

7. A light-transmissive resin sealed semiconductor according to claim 1, wherein the photoelectric transducer has a shunt resistance ranging from 1 $k\Omega \cdot cm^2$ to 500 $k\Omega \cdot cm^2$.

8. A light-transmissive resin sealed semiconductor according to claim 1, wherein the photoelectric transducer has a collecting electrode provided on the light-incident face thereof.

9. A light-transmissive resin sealed semiconductor according to claim 1, wherein the light-incident face of the semiconductor is further covered with a thin film of a fluoride polymer as the outermost layer.

10. A photovoltaic device comprising a photovoltaic element and a resin layer provided at a light-incident side of the photovoltaic element, wherein the resin layer comprises
at least one copolymer selected from the group consisting of ethylene-methyl acrylate, ethylene-ethyl acrylate, ethylene-butyl acrylate, ethylene-methyl methacrylate and ethylene-ethyl methacrylate.

11. The photovoltaic device according to claim 10, wherein the photovoltaic element comprises polycrystalline silicon.

12. The photovoltaic device according to claim 10, wherein the photovoltaic element comprises amorphous silicon.

13. The photovoltaic device according to claim 10, wherein the photovoltaic element comprises a pin junction semiconductor layer.

14. The photovoltaic device according to claim 10, wherein the resin layer contains a UV absorbing agent.

15. The photovoltaic device according to claim 10, wherein the copolymer is an acrylate or a methacrylate.

16. The photovoltaic device according to claim 10, wherein the photovoltaic element is provided with a collecting electrode in a wire pattern.

17. A photovoltaic device comprising a photovoltaic element, a resin layer provided at a light-incident side of the photovoltaic element, and a surface film, wherein the resin layer comprises
at least one copolymer selected from the group consisting of ethylene-methyl acrylate, ethylene-ethyl acrylate, ethylene-butyl acrylate, ethylene-methyl methacrylate and ethylene-ethyl methacrylate.

18. The photovoltaic device according to claim 17, wherein the photovoltaic element comprises polycrystalline silicon.

19. The photovoltaic device according to claim 17, wherein the photovoltaic element comprises amorphous silicon.

20. The photovoltaic device according to claim 17, wherein the photovoltaic element comprises a pin junction semiconductor layer.

21. The photovoltaic device according to claim 17, wherein the resin layer contains a UV absorbing agent.

22. The photovoltaic device according to claim 17, wherein the copolymer is an acrylate or a methacrylate.

23. The photovoltaic device according to claim 17, wherein the photovoltaic element is provided with a collecting electrode in wire pattern.

24. The photovoltaic device according to claim 17, wherein the surface film is formed of a polyfluoride resin.

25. A photovoltaic device comprising a photovoltaic element, a resin layer provided at a light-incident side of the photovoltaic element, a surface film, and a back face covering film, wherein the resin layer comprises
at least one copolymer selected from the group consisting of ethylene-methyl acrylate, ethylene-ethyl acrylate, ethylene-butyl acrylate, ethylene-methyl methacrylate and ethylene-ethyl methacrylate.

26. The photovoltaic device according to claim 25, wherein the photovoltaic element comprises polycrystalline silicon.

27. The photovoltaic device according to claim 25, wherein the photovoltaic element comprises amorphous silicon.

28. The photovoltaic device according to claim 25, wherein the photovoltaic element comprises a pin junction semiconductor layer.

29. The photovoltaic device according to claim 25, wherein the resin layer contains a UV absorbing agent.

30. The photovoltaic device according to claim 25, wherein the copolymer is an acrylate or a methacrylate.

31. The photovoltaic device according to claim 25, wherein the photovoltaic element is provided with a collecting electrode in a wire pattern.

32. The photovoltaic device according to claim 25, wherein the surface film is formed of a polyfluoride resin.

33. A process for producing a photovoltaic device, which comprises the steps of preparing a photovoltaic element, placing on the light-incident side of the photovoltaic element a sheet or pellet comprising at least copolymer one selected from the group consisting of ethylene-methyl acrylate, ethylene-ethyl acrylate, ethylene-butyl acrylate, ethylene-methyl methacrylate and ethylene-ethyl methacrylate, and then heat melting the sheet or the pellet to form a resin layer on the photovoltaic element.

34. The process for producing a photovoltaic device according to claim 33, wherein the photovoltaic element comprises polycrystalline silicon.

35. The process for producing a photovoltaic device according to claim 33, wherein the photovoltaic element comprises amorphous silicon.

36. The process for producing a photovoltaic device according to claim 33, wherein the photovoltaic element comprises a pin junction semiconductor layer.

37. The process for producing a photovoltaic device according to claim 33, wherein the resin layer contains a UV absorbing agent.

38. The process for producing a photovoltaic device according to claim 33, wherein the copolymer is an acrylate or a methacrylate.

39. The process for producing a photovoltaic device according to claim 33, wherein the photovoltaic element is provided with a collecting electrode in a wire pattern.

40. A photovoltaic device comprising a photovoltaic element, a resin layer provided at a light-incident side of the photovoltaic element, a surface film, a back face covering film, and a reinforcing plate, wherein the resin layer comprises at least one copolymer selected from the group consisting of ethylene-methyl acrylate, ethylene-ethyl acrylate, ethylene-butyl acrylate, ethylene-methyl methacrylate and ethylene-ethyl methacrylate.

41. The photovoltaic device according to claim 40, wherein the reinforcing plate is a steel plate.

* * * * *

UNITED STATES PATENT AND TRADEMARK OFFICE
CERTIFICATE OF CORRECTION

PATENT NO. : 5,684,325

DATED : November 4, 1997

INVENTOR(S): ICHIRO KATAOKA ET AL.

It is certified that error appears in the above-identified patent and that said Letters Patent is hereby corrected as shown below:

COLUMN 1

Line 14, "concerns." should read --concern.--; and "rise" should read --increases--;
Line 48, "polymer)" should read --polymers)--;
Line 55, "amount" should read --amounts--.

COLUMN 2

Line 2, "of a" should read --of--;
Line 23, "on a" should read --on an--;
Line 53, "further" should read -- Further,--.

COLUMN 3

Line 16, "of" (first occurrence) should read --of the--;
Line 42, "drop of" should read --a drop in--.

COLUMN 4

Line 31, "example" should read --examples--;
Line 34, "metal thin" should read --thin metal--;
Line 40, "has" should read --has a--.

COLUMN 6

Line 6, "of" should read --of a--;
Line 7, "as a" should read --as an--.

UNITED STATES PATENT AND TRADEMARK OFFICE
CERTIFICATE OF CORRECTION

PATENT NO. : 5,684,325

DATED : November 4, 1997

INVENTOR(S): ICHIRO KATAOKA ET AL.

It is certified that error appears in the above-identified patent and that said Letters Patent is hereby corrected as shown below:

COLUMN 7

Line 57, "the" should read --to the--.

COLUMN 8

Line 24, "photostabilizers" should read --photostabilizer--;
Line 32, "is" should be deleted.

COLUMN 10

Line 8, "Semiconductor" should read --semiconductor--;
Line 19, "in a" should read --in an--.

COLUMN 11

Line 1, "galvernized" should read --galvanized--;
Line 17, "galvernized" should read --galvanized--;
Line 41, "minutes" should read --5 minutes--.

COLUMN 12

Line 3, "The ones" should read "Solar cell modules";
Line 4, "was" should read --were--;
Line 6, "modules" should read --module--;
Line 44, "depends" should read --depends on--
Line 56, "Group," should read --group,--.

UNITED STATES PATENT AND TRADEMARK OFFICE
CERTIFICATE OF CORRECTION

PATENT NO. : 5,684,325

DATED : November 4, 1997

INVENTOR(S): ICHIRO KATAOKA ET AL.

It is certified that error appears in the above-identified patent and that said Letters Patent is hereby corrected as shown below:

COLUMN 15

Line 17, "copolymer one" should read --one copolymer--.

Signed and Sealed this

Twenty-eighth Day of April, 1998

Attest:

BRUCE LEHMAN

Attesting Officer  Commissioner of Patents and Trademarks